United States Patent [19]

Widmann

[11] 4,047,975
[45] Sept. 13, 1977

[54] PROCESS FOR THE PRODUCTION OF A BIPOLAR INTEGRATED CIRCUIT

[75] Inventor: Dietrich Widmann, Unterhaching, Germany

[73] Assignee: Siemens Aktiengesellschaft, Berlin & Munich, Germany

[21] Appl. No.: 702,062

[22] Filed: July 2, 1976

[30] Foreign Application Priority Data

July 2, 1975 Germany .............................. 2529598

[51] Int. Cl.² .................. H01L 21/265; H01L 21/302
[52] U.S. Cl. ....................................... 148/1.5; 29/578;
29/580; 148/187; 156/643; 156/647; 204/192 R; 250/251; 357/20; 357/40; 357/48; 357/55; 357/56; 357/91
[58] Field of Search ................... 148/1.5, 175, 187; 204/192; 250/84; 156/643, 647, 659; 29/578, 580; 357/20, 40, 48, 55, 56, 91

[56] References Cited

U.S. PATENT DOCUMENTS

| | | | |
|---|---|---|---|
| 3,472,751 | 10/1969 | King | 204/192 |
| 3,657,542 | 4/1972 | Futch, Jr. et al. | 250/84 |
| 3,675,313 | 7/1972 | Driver et al. | 357/55 X |
| 3,823,352 | 7/1974 | Pruniaux et al. | 357/56 X |
| 3,884,788 | 5/1975 | Maciolek et al. | 204/192 |
| 3,920,482 | 11/1975 | Russell | 148/1.5 |
| 3,950,233 | 4/1976 | Rosvold | 357/55 X |
| 3,966,514 | 6/1976 | Feng et al. | 148/187 |
| 3,974,298 | 3/1976 | Tiefert | 148/175 |

Primary Examiner—L. Dewayne Rutledge
Assistant Examiner—W. G. Saba
Attorney, Agent, or Firm—Hill, Gross, Simpson, Van Santen, Steadman, Chiara & Simpson

[57] ABSTRACT

A method of making a bipolar integrated circuit which requires neither an epitaxial layer nor a buried layer. The required doping of a semiconductor substrate, e.g., silicon, is obtained by a series of etching steps alternated with ion implantation steps of a selected impurity type, and heat treatment steps. The emitter and collector zones of a transistor are formed on sloping walls of adjacent troughs formed in a semiconductor substrate. The base zone of a transistor is formed on the confronting sloping wall of one of these troughs. Lead conductors are located in the troughs along sloping wall portions of the troughs.

16 Claims, 11 Drawing Figures

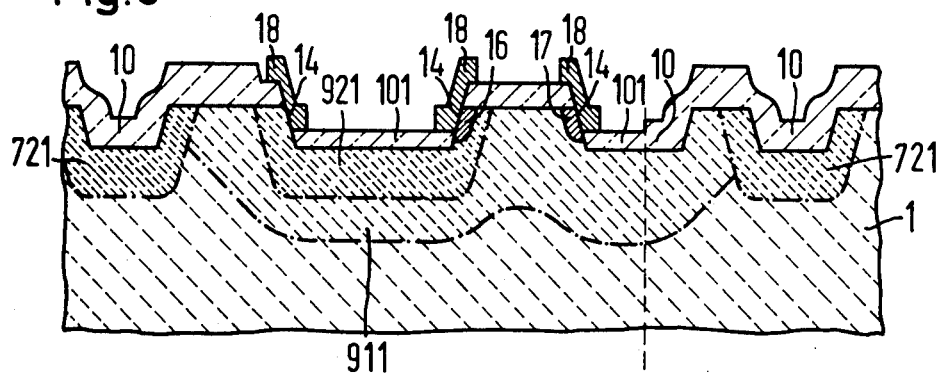
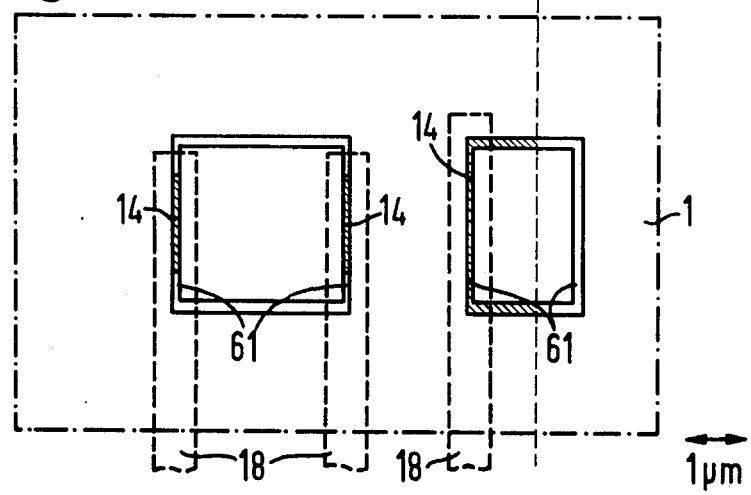
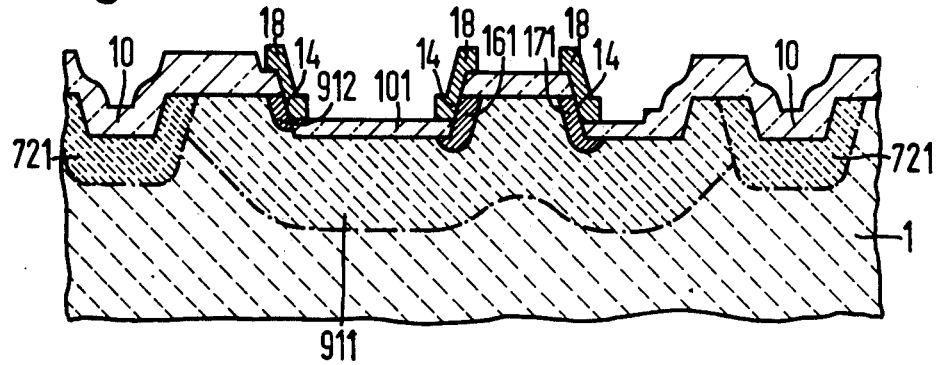

PROCESS FOR THE PRODUCTION OF A BIPOLAR INTEGRATED CIRCUIT

BACKGROUND OF THE INVENTION

The invention relates to a bipolar integrated circuit and to a method of making the same.

In known bipolar integrated circuits, the production process requires a greater outlay than the process for the production of integrated MOS circuits because an epitaxial layer on the semiconductor substrate and a buried layer beneath the epitaxial layer are required.

A further disadvantage of knwon bipolar circuits consists in that the area requirement which is governed in particular by the requisite insulating frames around the individual transistors, by adjustment tolerances and by the requisite safety clearances between the variously doped zones, is relatively large.

BRIEF SUMMARY OF THE INVENTION

An object of the present invention is to provide integrated bipolar transistors in which the above mentioned disadvantages are avoided.

This aim is realized by a bipolar integrated circuit which is formed by a series of process steps which include masking steps, ion implanation steps and heating steps.

An advantage of the invention consists, in particular, in that the process for the production of the bipolar integrated circuits of the invention is simplified in that no epitaxial layer, and consequently, no buried layer are provided.

Advantageously, the circuits in accordance with the invention have a very small area requirement on account of the self-adjusting masking steps.

A further advantage of the invention consists in that in the production of the circuits of the invention, it is possible to construct emitter zones and contact windows having dimensions of less than 1μ without the need to produce these sub-micron-structures photo-lithographically.

Further details of the invention, and its developments are given in the description and the Figures.

BRIEF DESCRIPTION OF THE DRAWINGS

FIGS. 1 to 10 show the individual process steps for the production of an integrated bipolar semiconductor circuit in accordance with the invention.

FIG. 11 shows a pnp transistor produced in accordance with the invention.

DESCRIPTION OF THE PREFERRED EMBODIMENTS

Figure 1:
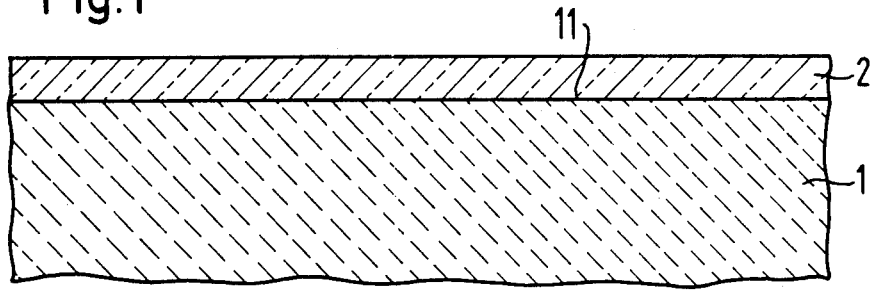

In the following, the process in accordance with the invention will be explained, making reference to FIGS. 1 to 10. An electrically insulating layer 2 is applied to the semiconductor layer 1, which is, preferably, a homogeneously doped, monocrystalline silicon wafer whose surface 11 is a crystallographic (100) - surface. Preferably, the layer 2 is produced by thermal oxidation and possesses a thickness of, for example, 1.2μm. The homogeneously doped substrate 1 is, for example, a silicon material homogeneously doped with $10^{15}$ boron ions per $cm^3$ (FIG. 1).

Figure 2:
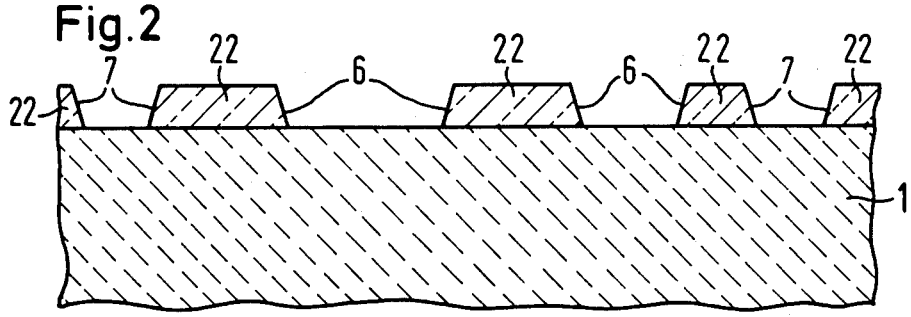

In a further process step, using a conventional photo-lithographic technique, as illustrated in FIG. 2, openings 6 are provided in the $SiO_2$ layer 2 at the location at which the transistor zones are later to be formed, and likewise openings 7 for the insulation frame. The remaining parts of the layer 2 are designated 22.

Figure 3:
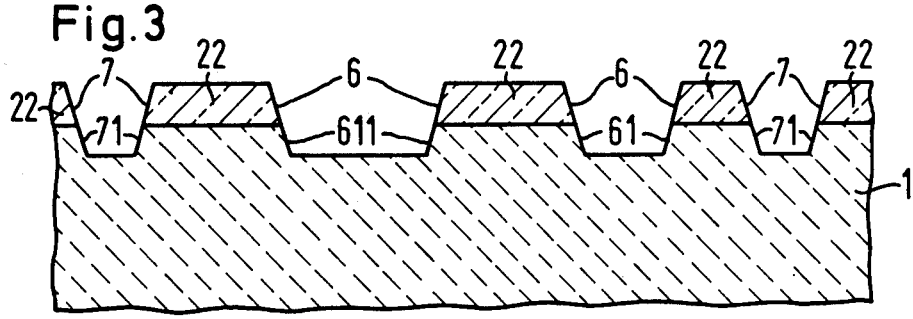

As illustrated in FIG. 3, in a further process step, the silicon which has been exposed in the openings is partially removed in a preferably alkaline etching medium. Etching troughs 61, 611 and 71 possessing a depth of approximately 1μm, for example, are thereby formed beneath the openings 6 and 7 (FIG. 2) within the silicon.

Figure 4:
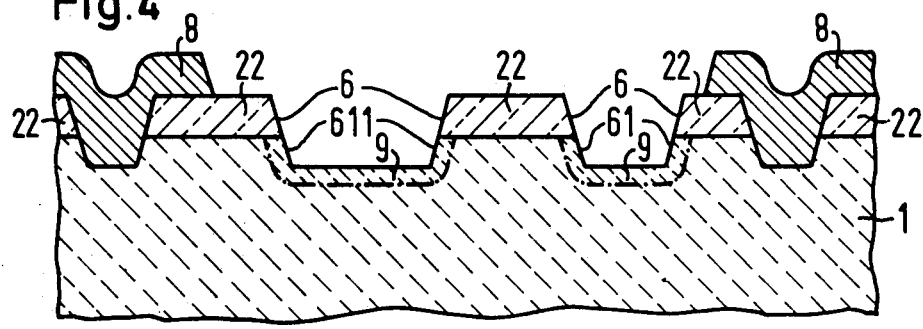

In a further process step which in represented in FIG. 4, the two outer openings 7, 71 are masked, whereupon donors, such as, e.g., phosphorus ions are implanted. The masking of the two outer openings 7, 71 is preferably effected with photo resist or aluminum. On account of the masking of the outer openings 7, 71, the implanted phosphorous ions penetrate only in the central openings 6, 61 and 611 into the silicon substratel. In this way, the n-implanted troughs 9 are formed by ion implantation in the p-doped substrate 1.

Figure 5:
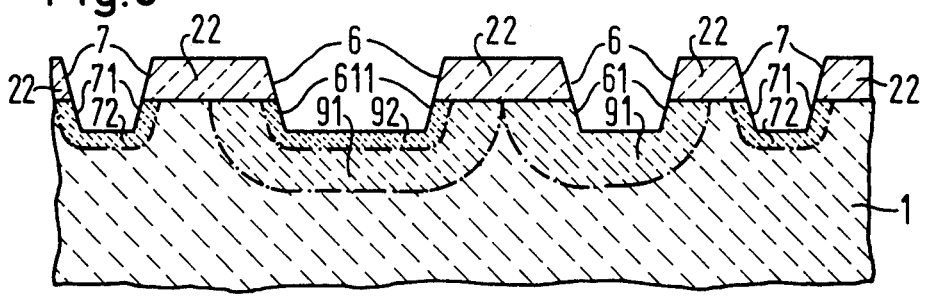

As can be seen from FIG. 5, the photo-resist or aluminum masking layer 8 is removed. In a subsequent annealing process, the arrangement is heated to approximately 1100° C, in an inert gas atmosphere whereby the phosphorus ions diffuse further into the silicon substratel. In this way, a zone 91 having an approximately homogeneous phosphorus ion concentration of, e.g., $10^{16}cm^{-3}$, is formed at a distance of approximately 1.5μm from the surface. In the next process step, acceptor ions, for example, boron ions, are introduced into three of the four openings, preferably again by ion implanation. In this way, p+ doped zones 72 are produced beneath the openings 71 which represent the insulation frame, and a p+ doped zone 92 is produced beneath the opening 611. The p+ doped zone 92 serves as base zone of the bipolar transistor. To prevent boron ions from penetrating through the second opening of the openings 61, this must be covered in masking fashion prior to the ion implanation, as already described in respect of FIG. 4. This can be again effected, e.g., by a photo resist layer or a structured aluminum layer produced in the conventional photo-lithographic technique. Like the aforementioned masking step, this photo-lithographic step is self-adjusting, as a misadjustment of the masking structure within the permitted adjustment accuracy (here ± 1μm) has no influence on the position and size of the zone to be adjusted.

Figure 6:
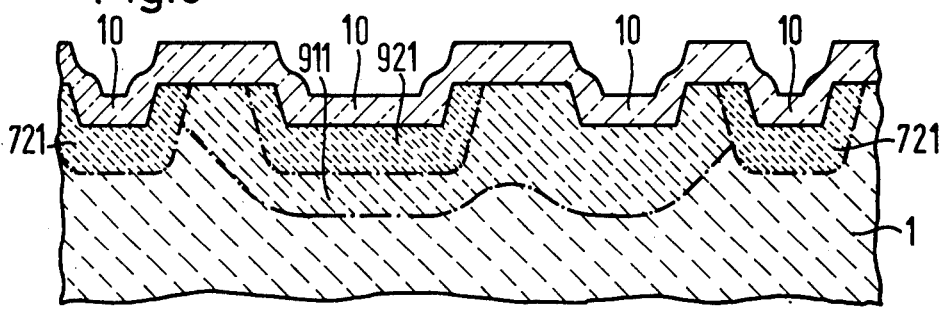

As represented in FIG. 6, following the boron implanation (for example $10^{14}$ boron ions per $cm^2$), the masking layer is removed above the right opening, and a thermal oxidation follows at a temperature of, e.g., 1100° C. This oxidation ensures that the boron ions reach a desired penetration depth of, e.g., 1.3μm, as a result of which the zones 921 and 721 represented in the Figure are formed. At the same time, a desired penetration depth of the phosphorus ions of, e.g., 4μm is achieved, and the zones 91 expand to such an extent that they join up to form a zone 911. A thermal oxidation layer is formed on the entire surface, whereby parts of the previously existing oxide layer are reinforced, and oxide layers having a desired thickness of, e.g., 0.8μm are formed in the openings. In FIG. 6, these zones of the insulating layer which has been produced by thermal oxidation are referenced 10.

In a further process step, the surface of the arrangement is covered with a masking layer, with the exception of the opening arranged above the zone 921 and the half of the adjacent opening lying above the trough which relates to the production of the transistor. This masking step is, likewise, self-adjusting, however, only in the direction marked with the reference 13 in FIG. 7.

Figure 7:
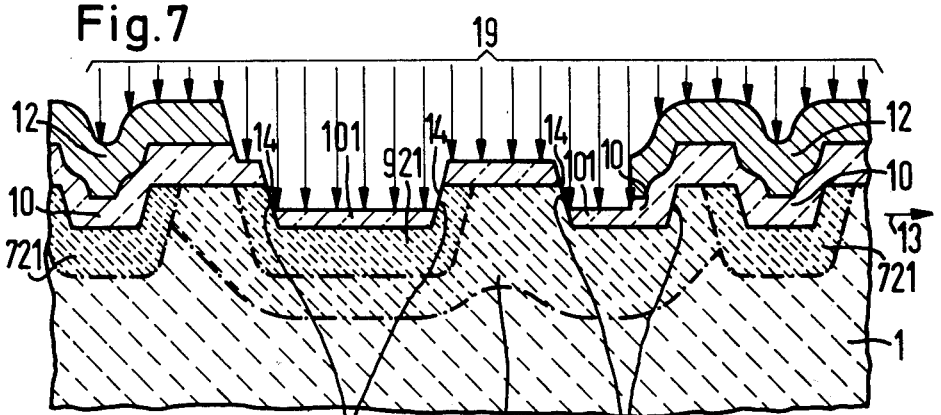

In FIG. 7, the masking layer is referenced 12. Now, in an ion etching step, the surface of the semiconductor arrangement is exposed to a homogeneous, vertical ion beam 19, which is neutralized by electrons. The oxide is here removed approximately twice as rapidly at the oblique flanks 14 as on the horizontal surfaces. In this way, it is ensured that the silicon material is exposed on the oblique flanks 14 when a residue 101 of the oxide layer 10 is still present on the horizontal surfaces above the opening 611 and half the opening 61. The etching process is terminated when the silicon is exposed or is slightly etched on the flanks 14. The exposed silicon zones 14 represent the contact windows of the integrated circuit. The oxide thickness then amounts to between 0.4 and 1.3μm on the individual zones. Within those zones, which are not covered by the masking layer, and which relate to the transistor production, the thickness of the oxide layer 101 is here approximately 04.μm (FIG. 7).

Figure 8:
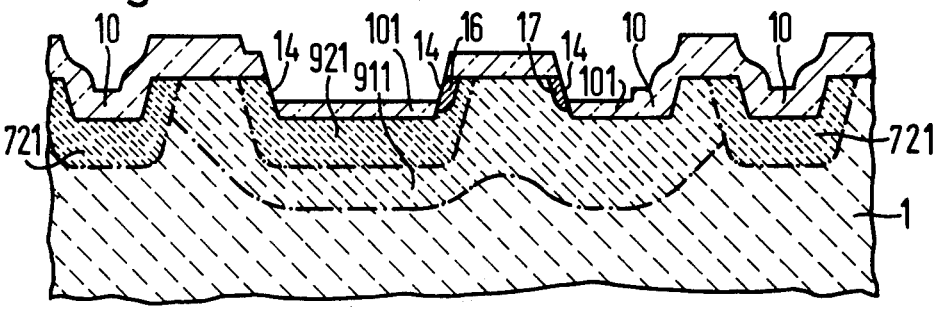

As can be seen from FIG. 8, in a further process step, the masking layer 12 is removed. Then a new masking layer, which preferably again consists of photo resist or aliminum is applied, this masking layer being structured in such a manner that of the exposed. silicon zones, only those which are not to receive the subsequent n+ doping are covered. This n+ doping is effected by ion implanation of donor ions such as, for example, phosphorus, arsenic or antimony in a relatively high concentration for the formation of the emitter zones 16 and the collector terminals 17. The dose of the implanted ion here amounts to approximately $10^{16}$ ions per $cm^2$. The preceding photo-lithographic process is again self-adusting.

Following the implantation step, the masking layer is again removed, whereupon an annealing process can follow in order to set an emitter penetration depth of, e.g. 0.8μm.

In a further process step, as illustrated in FIG. 9, using conventional photo-lithographic processes or lift-off techniques, the conductor paths which preferably consist of aluminum or an aluminum-copper-silicon-alloy are applied. In FIG. 9, the aluminum paths are referenced 18.

The minimum space requirement for an integrated bipolar npn transistor produced by the described process, based on minimum structure dimensions of 2μm and an adjustment tolerance of ±1μm is 22μm 1482 m = 308μm (FIG. 10). Details of FIG. 10 which have already been described in association with the other Figures bear the corresponding references. The dash-dotted line indicates the middle of the insulation frame.

The process of the invention can be used to produce not only bipolar npn transistors, but also all other important elements of integrated bipolar circuits, such as, e.g., pn diodes, Schottky diodes, resistors or multi-emitters without an extra outly.

Conventional lateral pnp transistors can also be integrated without an extra outlay. In addition, the process of the invention is suitable for the production of improved pnp transistors with a higher current amplification (FIG. 11), because the arrangement of emitter zone 161 and collector zone 171 reduces the effects of the parasitic substrate pnp transistor. The construction of such a pnp transistor requires an additional masking step which advantageously is likewise self-adjusting, and an additional boron ion implanation.

In an arrangement corresponding to that shown in FIG. 7, but without the zone 91, the emitter zone 161 and the collector zone 171 are produced by boron implantation. By means of a further phosphorus implantation, the base terminal zone 912 is produced. These two last mentioned steps would be interposed between the process stages of FIGS. 7 and 8 in the process sequence illustrated in FIGS. 1 to 10.

A n+ collector depth diffusion can optionally be provided in order to reduce the collector bulk resistance. The corresponding masking and implantation is then effected between the process stages represented in FIGS. 4 and 5.

The proposed production process is suitable not only for bulk silicon substrates, but also for SOS techniques.

It will be apparent to those skilled in the art that many modifications and variations may be effected without departing from the spirit and scope of the novel concepts of the present invention.

I claim as may invention:

1. The method of making a bipolar integrated circuit having transistors therein, which includes covering a semiconductor substrate of a first impurity type with an insulating layer, etching a plurality of non-intersecting troughs having sloping side walls in said insulating layer and partially into said substrate, doping by ion implantation the substrate side walls and the bases of said troughs with impurity ions opposite to the impurity type of said substrate, annealing said substrate to cause the impurities introduced by ion implantation to further diffuse and to thereafter provide base zones for said transistors, further doping the side walls and the bases of a first group of said troughs with impurity ions of the same impurity type as said substrate while leaving a second group of troughs still doped with impurities of the opposite type to said substrate, thermally oxidizing said substrate, then carrying out an ion etching step with a homogeneous vertical ion beam until portions of the substrate surface of the sloping side walls of said troughs are exposed, selectively doping by ion implantation to form emitter zones and collector zones, whereby transistors are formed between selected troughs, and forming circuit conductors on the sloping side walls in contact with said emitter zones, said collector zones and said base zones, respectively.

2. The method according to claim 1, in which the semiconductor substrate is silicon.

3. The method according to claim 2, in which the insulating layer is silicon dioxide.

4. The method according to claim 3, in which an approximately 1.2μm thick layer is produced.

5. A method according to claim 1, where photoresist layers or aluminum layers are used for masking.

6. A process for the production of a bipolar integrated circuit which includes forming an electrically insulating layer on a substrate consisting of taking a doped semiconductor material, forming by a photo-lithographic technique first openings having oblique flanks for transistor zones and second openings for insulation frames in the electrically insulating layer, thereafter partially removing the material of the substrate which has been exposed beneath the openings in said insulating layer, then applying masking layers above said second openings for the insulation frames, introducing impurities of the opposite type to those of said substrate into those zones of the substrate which lie beneath the first troughs so that zones doped oppositely to the substrate are formed beneath the first troughs, removing the masking layers, annealing the substrate so that those impurities contained in the zone below the first troughs diffuse further into the substrate, covering at least one of the first troughs with a masking layer while leaving uncovered other of said first troughs and said second troughs, introducing impurities of the same type as said substrate into the zones not covered by masking layer, removing the masking layer above the covered ones of said troughs, applying an insulating layer to the entire surface, annealing the substrate to cause the impurities of said opposite type to reach a greater penetration depth, applying a masking layer except over said at least one of said first troughs and except over approximately one-half of said other of said first troughs, subjecting the arrangement to a homogeneous vertical ion beam in an ion etching apparatus where the oxide is removed more rapidly on the oblique flanks of the openings than on the horizontal surfaces, terminating the etching process when the semiconductor material is exposed on the oblique flank, removing the masking layer and applying a new masking layer which leaves uncovered only those exposed semiconductor material which are to be doped opposite to the substrate, again doping the exposed flanks, whereby an emitter zone and a collector terminal are formed, removing the masking layer, and applying conductor paths using conventional photo-lithographic process techniques or lift-off techniques.

7. A process as claimed in claim 6, in which a silicon substrate is used as substrate.

8. A process as claimed in claim 7, in which a thermally oxidized $SiO_2$ layer is used as the electrically insulating layer.

9. A process as claimed in claim 8, in which an approximately 1.2μm thick layer is produced.

10. A process as claimed in claim 6, in which photoresist layers or aluminum layers are used as masking layers.

11. A process as claimed in claim 6, in which a layer produced by thermal oxidation and possessing a thickness of approximately 0.8μm is used as the insulating layer.

12. A process as claimed in claim 6, in which for the ion implantation, boron ions are used as acceptors and phsophorus ions are used as donors.

13. A process as claimed in claim 6, in which the various annealing processes are carried out in such a manner that from the surface of the first troughs the zones therebeneath extend approximately 4μm into the substrate, and from this surface, the zones doped the same as said substrate extend approximately 1.3μm into the substrate, and that from the flanks of said first troughs the emitter zones and collector terminal zones extend approximately 0.8μm into the substrate.

14. A process as claimed in claim 6, in which the impurities are introduced into the zones doped the same as said substrate, into the zones doped opposite to said substrate, into the emitter zone and into the collector zone with the aid of ion implantation.

15. A process for the production of a bipolar integrated circuit in a substrate consisting of doped semiconductor material, wherein an electrically insulating layer is applied to the surface of the substrate, in a further process step using a photolithographic lithographic technique, openings for transistor zones and openings for insulation frames are introduced into the electrically insulating layer, the material of the substrate exposed beneath the openings is partially removed so that first etching troughs are formed beneath certain of the openings in the substrate and second etching troughs are formed beneath other of the openings in the substrate, masking layers are applied above the second openings, impurities are introduced into those zones of the substrate which lie beneath the first troughs so that zones doped oppositely to the substrate are formed beneath the first troughs, then the masking layers are removed and the arrangement annealed so that those impurities contained in the zones beneath said first troughs diffuse further into the substrate so that such zones are enlarged, thereafter one of the first troughs is covered with a masking layer, and impurities are introduced into the zones beneath one of the first troughs and second troughs, so that these zones are doped oppositely to the zones beneath the first troughs, the masking layer above one of the first troughs is then removed, and an electrically insulating layer is applied to the surface of the entire arrangement, then the entire arrangement is annealed, to ensure that the impurities arranged in the zones below the second troughs attain a greater penetration depth, and that the zones beneath the first troughs simultaneously extend to such an extent that they join to form an enlarged zone beneath adjacent said first troughs, a masking layer next is applied, which masking layer does not cover the zone above one of the first troughs, and half of the zone above the adjacent first troughs, the surface of the entire semiconductor arrangement then is exposed to a homogeneous vertical ion beam in an ion etching installation, whereby the oxide is removed more rapidly at the oblique flanks of the openings than on the horizontal surfaces, the etching process is terminated when the semiconductor material is exposed on the oblique flanks, thereafter the masking layer is removed, and a new masking layer is applied which is structured in such a manner that of the exposed silicon zones those which are subsequently to be doped to form the emitter and collector zones are not covered, doping then is effected, whereby an emitter zone and a collector zone are formed, the masking layer is removed, and in an additional masking step, of the exposed silicon zones only that zone which is subsequently doped with impurities of the opposite conductivity type to that of the substrate is not covered, whereby a base terminal is formed, and that in a further process step using conventional photo-lithographic process techniques or using lift-off techniques conductor paths are applied.

16. A process as claimed in claim 15, in which the emitter zone, the collector zone and the base terminal zone are produced by ion implantation, and that from the flanks, these zones extend into the substrate to a depth of approximately 0.8μm.

* * * * *